United States Patent [19]
Gelorme et al.

[11] Patent Number: 6,013,414
[45] Date of Patent: Jan. 11, 2000

[54] PHOTOSENSITIVE POLYIMIDE-PRECURSOR FORMULATION

[75] Inventors: Jeffrey Donald Gelorme, Plainville, Conn.; Martin Joseph Goldberg, Mahopac, N.Y.; Nancy Carolyn LaBianca, Yalesville; Jane Margaret Shaw, Ridgefield, both of Conn.

[73] Assignee: International Business Machines Corporation, Armonk, N.Y.

[21] Appl. No.: 08/357,789

[22] Filed: Dec. 16, 1994

Related U.S. Application Data

[63] Continuation of application No. 08/122,886, Jul. 13, 1993, abandoned, which is a continuation of application No. 07/782,943, Oct. 25, 1991, abandoned.

[51] Int. Cl.[7] ....................................... G03C 1/73
[52] U.S. Cl. ................................. 430/281.1; 430/283.1; 430/906
[58] Field of Search .................................. 430/281, 283, 430/906, 281.1, 283.1

[56] References Cited

U.S. PATENT DOCUMENTS

| | | | |
|---|---|---|---|
| 4,243,743 | 1/1981 | Hiramoto et al. | 430/281.1 |
| 4,565,767 | 1/1986 | Kataoka et al. | 430/196 |
| 4,670,535 | 6/1987 | Sugio et al. | 525/421 |
| 4,741,988 | 5/1988 | Van der Zande et al. | 430/281.1 |
| 4,778,859 | 10/1988 | Ai et al. | 528/220 |
| 4,803,147 | 2/1989 | Mueller et al. | 430/288.1 |
| 4,837,299 | 6/1989 | Peters et al. | 528/353 |
| 5,043,248 | 8/1991 | Uekita et al. | 430/270.1 |

FOREIGN PATENT DOCUMENTS 0 202 705  11/1986  European Pat. Off. .

OTHER PUBLICATIONS

March & Windwer, General Chemistry, pp. 162–163, 1979.

Hackh's Chemical Dictionary, 4th Ed., Grant editor, p. 15, McGraw–Hill Book Co., 1969.

Database WPIL Week 8503, Derwent Publications Ltd., London, GB; AN 85–015859 & JP–A–59 212 833 (Mitsubishi Electric Corp.) Dec. 1, 1984–Abstract.

*Primary Examiner*—Bernard Codd
*Attorney, Agent, or Firm*—Pollock, Vande Sande & Armenick; Daniel P. Morris

[57] ABSTRACT

Photosensitive compositions containing a polyimide precursor and a complex cation of a polymerizable carboxylic acid functional compound with a tertiary amino functional group; and use thereof to provide a pattern.

9 Claims, No Drawings

PHOTOSENSITIVE POLYIMIDE-PRECURSOR FORMULATION

This application is a continuation of Ser. No. 08/122,886 filed on Jul. 13, 1993 now abandoned which is a continuation of Ser. No. 07/782,943 filed on Oct. 25, 1991 now abandoned.

DESCRIPTION

1. Technical Field

The present invention is concerned with polyimide precursor compositions that exhibit increased resolution and photosensitivity. The present invention is also concerned with use of the compositions in packaging applications, such as microcircuit fabrication.

2. Background Art

Polyimides are currently used to a large extent in microcircuit fabrication as carrier layers and insulating layers in electronic packaging of semiconductor chips and microcircuitry. When the polyimides are provided on a substrate, such are normally applied as precursors in the polyamic acid form that contains free carboxylic acid groups. For the most part, the fabrication of photopatterned polyimide layers is carried out using non-photoreactive polyimide precursors with the aid of conventional photoresist materials. In addition, there have been suggestions to directly photopattern photocrosslinkable polyimide precursors to thereby significantly reduce the number of processing steps. For example, see U.S. Pat. Nos. 4,670,535 and 4,778,859.

There are a number of commercially available photocrosslinkable polyimide precursors including those based on the chemical principle generally referred to as "Siemans Technology." For instance, one typical photosensitive polyimide precursor is a methacrylate polyimide ester. Also, such formulations typically include a multifunctional monomer along with the photosensitive polyimide precursor such as pentaerythritol triacrylate, trimethylolpropane triacrylate and tripolyethylene oxide triacrylate. It has been found that crosslinking through multifunctional monomers decreases solubility-in-developer faster, which in turn tends to increase photospeed and resolution in negative photoresist formulations. However, these types of formulations undergo solvent swelling during development, which, in turn, decreases resolution and less of thickness and adhesion upon development.

It has also been suggested to provide photosensitivity in a polyimide through the ionic salt complexation between a tertiary amine acrylate, such as dimethylamino-propanol methacrylate, and the carboxylic acid functionality of the polyamic acid. These formulations are much easier to synthesize than the polyester imides. However, such formulations exhibit low photocontrast, resolution, and sensitivity. Also, such require water-solvent developer mixtures and relatively long development time in the vicinity of about six minutes.

Accordingly, it would be desirable to provide a photosensitive composition of a polyimide precursor that exhibits increased resolution and sensitivity along with reduced swelling and thickness loss upon development. It would also be advantageous to limit the adhesion loss upon development.

SUMMARY OF INVENTION

The present invention overcomes the above-discussed problems of the prior art concerning photosensitive polyimide precursor composition. In particular, the present invention provides photosensitive polyimide precursor compositions that exhibit increased resolution, increased sensitivity along with reduced thickness loss upon development. The compositions of the present invention also exhibit good adhesion to a myriad of substrates even upon development.

The photosensitive compositions of the present invention comprise a polyimide precursor, and a complex cation of a polymerizable carboxylic acid functional compound with a tertiary amino functional group.

The present invention is also concerned with using the above-defined photosensitive compositions to fabricate a pattern. The process comprises providing a layer of the photosensitive and then imagewise exposing selected portions of the layer to actinic radiation to cause crosslinking of the exposed portions. The unexposed portions of the layer are removed to thereby provide the pattern.

BEST AND VARIOUS MODES FOR CARRYING OUT INVENTION

The polyimide precursors (polyamic acids) employed in accordance with the present invention include unmodified polyimide precursors such as precursors of polyester imides, polyamide-imide-esters, polyamide-imides, polysiloxane-imides, as well as other mixed polyimides. Such are wellknown in the prior art and need not be described in any great detail.

Polyamic acids are commercially available such as from DuPont under the trade designation "Pyralin" and Asahi Corp. under the trade designation Pimel 6240. Such polyimide precursors come in many grades including those available Pyralin polyimide precursors from DuPont under the further trade designations PI-2555, PI-2545, PI-2560, PI5878, PIH-61454, and PI-2540. These particular Pyralin materials are all pyromelletic dianhydride-oxydianaline (PMDA-ODA) polyimide precursors.

Generally, the polyamic acids include the following recurring unit:

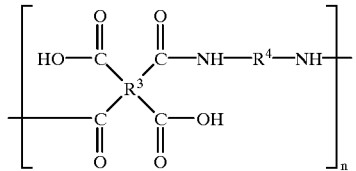

where n is an integer representing the number of repeating units to provide a molecular weight usually about 10,000 to about 100,000. $R_3$ is at least one tetravalent organic radical selected from the group consisting of:

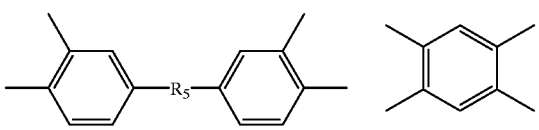

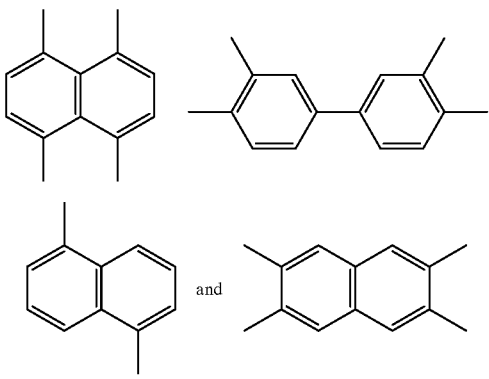

$R_5$ being selected from the group consisting of divalent aliphatic hydrocarbon radicals having from 1 to 4 carbon atoms and carbonyl, oxy, sulfo, hexafluoroisopropylidene and sulfonyl radicals and in which $R_4$ is at least one divalent radical selected from the group consisting of:

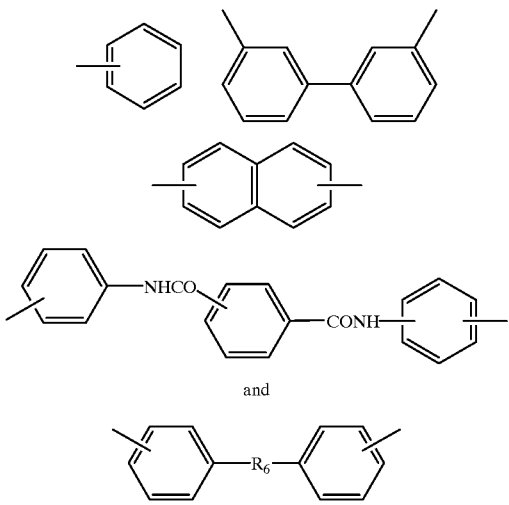

in which $R_6$ is a divalent organic radical selected from the group consisting of $R_2$, silicon, and amino radicals. Polymers containing two or more of the R and/or $R_1$ radicals, especially multiple series of $R_1$ containing amido radicals, can be used.

The preferred polyimide precursors are the precursors of polyamide-imide-esters, such as Pimel 6240, which is a polyamide-imide-acrylate ester. More particularly, Pimel 6240 is a benzophenone tetracarboxylic dianhydride/ methylene diamine/metaphenylene diamine hydroxyethyl methacrylate ester.

The reactive modifier required by the present invention is a complex cation of a polymerizable carboxylic acid functional compound with a tertiary amino functional group. Preferably the tertiary amino functional material contains a polymerizable moiety such as an ethylenically unsaturated moiety and/or contains multiple tertiary amino sites. Preferred complex materials employed pursuant to the present invention are represented by the following formula:

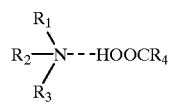

wherein each of $R_1$, $R_2$ and $R_3$ is individually selected from the group of alkyl groups acrylyl and methacryl groups and more typically containing 2 to 6

$$(-CH_2CH_2O\overset{O}{\overset{\|}{C}}-\underset{CH_3}{\overset{|}{C}}=CH_2);$$

and $R_4$ is selected from the group of

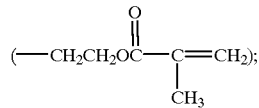

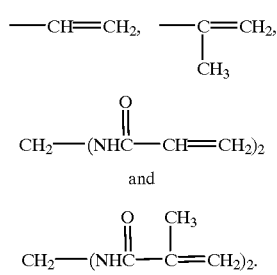

The complex usually includes about 1 mole of the carboxylic acid functional compound for each tertiary nitrogen atom of the tertiary amino functional material.

Examples of suitable complex modifiers used in the present invention are 1,1 bis acrylamide acetic acid complex with dimethylamino propanol methyl methacrylate and 1,1 bis acrylamide acetic acid complex with hexamethylene tetramine.

Usually, the amount of the reactive complex modifier material relative to polyimide precursor is such that the amount of the functional groups of the complex modifier is about 3% to about 15% by weight and preferably about 5% to about 10% by weight based upon the weight of the polyimide precursor reactive groups.

The reactive complex modifiers required by the present invention are compatible with the polyimide precursors and form soluble compositions therein. At temperatures of about 20° C. such form stable compositions.

Upon exposure to actinic light such as ultraviolet wavelengths of 300 to 500 nanometers, reaction between the polyamide-imide-ester and cation complex occurs resulting in a cross-linked polyimide. Typically, the exposure dosage is about 100 to about 1000 millijoules/cm² and more typically about 400 to about 600 millijoules/cm² using ultraviolet light of 300 to 500 nanometers.

When compositions of the present invention are to be used in forming a pattern, the exposure to the actinic radiation is imagewise exposure of selected portions through a photomask. The unexposed portions are then removed such as by dissolution in a developer such as N-methylpyrrolidone, dimethylformamide, butyrolactone, dimethylsulfoxide, acetates, such as butylacetate and 2-methoxyacetate; ethers; tetrahydrofuran; aromatic hydrocarbons and substituted aromatic hydrocarbons such as benzene, toluene, xylene and chlorobenzene.

A preferred developer is a mixture of about 10% by volume of xylene and about 90% by volume of N-methylpyrrolidone. The developing normally takes about 1 to about 10 minutes and preferably about 3 to about 5 minutes.

If desired, the polyamic acid and reactive modifier can be admixed in the presence of an organic solvent that is non-reactive with the polyamic acid. It is preferred that the inert organic solvent be aprotic. The most preferred solvents are the aromatic hydrocarbons and substituted aromatic hydrocarbons including benzene, toluene, xylene, and chlorobenzene. Other solvents include N-methyl pyrrolidone; γ-butyrolactone; acetates, such as butyl acetate and 2-methoxy acetate; ethers; and tetrahydrofuran.

The following non-limiting examples are presented to further illustrate the present invention.

EXAMPLE 1

To Pimel 6240, a polyamic acid composition available from Asahi Corp. is added in amount of 10% by weight of the Pimel 6240, an acid-base complex of 1 mole of 1,1,-bis acrylamido acetic acid and 1 mole of dimethylamino propanol methyl methacrylate. The composition is then coated to a thickness of about 20 microns onto a silicon wafer. The coated layer is then exposed imagewise through a photomask to actinic radiation from ultraviolet light at a dosage of 50 millijoules.

After exposure, the image is developed using a mixture of 10% by volume of xylene and 90% by volume of N-methylpyrrolidone for 3½ minutes to remove the unexposed portions of the layer. The composition exhibits excellent resolution without loss of adhesion of the layer.

EXAMPLE 2

Example 1 is repeated except that an acid-base complex of 4 moles of 1,1-bis acrylamido acetic acid complex and 1 mole of hexamethylene tetramine is used as the modifier for the Pimel 6240. The results obtained are similar to those of Example 1 with somewhat better resolution.

COMPARISON EXAMPLE 3

Example 1 is repeated except that no acid-base complex is used. Upon development, there is total loss of adhesion due to swelling of the layer in the developer.

What is claimed is:

1. A photosensitive composition comprising a polyimide precursor; and as a modifier reactive with said polyimide precursor a complex of a polymerizable carboxylic acid functional compound with a tertiary amino functional group wherein said complex is represented by the formula:

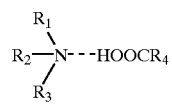

wherein each of $R_1$, $R_2$ and $R_3$ is individually selected from the group of alkyl groups, acrylyl and methacryl groups; and $R_4$ is selected from the

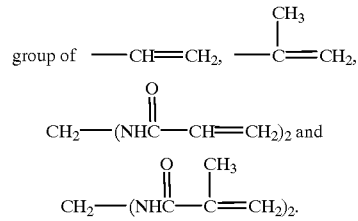

2. The composition of claim 1 wherein said complex is a complex of 1,1 bisacrylamide acetic acid with dimethylaminopropanol methyl methacrylate.

3. The composition of claim 1 wherein the amount of the functional groups of said modifier is about 3% to 15% by weight based upon the weight of the polyimide precursor reactive groups.

4. The composition of claim 3, wherein said reactive groups are carboxylic acid groups.

5. The composition of claim 1 wherein the amount of the functional groups of said modifier is about 5% to 10% by weight based upon the weight of the polyimide precursor reactive groups.

6. The composition of claim 5 wherein said reactive groups are carboxylic acid groups.

7. The composition of claim 1 wherein said polyimide precursor is a polyamide-imide-ester.

8. The composition of claim 1 wherein said polyimide precursor is a polyamide-imide-acrylate ester.

9. The composition of claim 1 wherein said polyimide precursor is a benzophenone tetracarboxylic dianhydride/methylene diamine/metaphenylene diamine hydroxyethyl methacrylate ester.

* * * * *